United States Patent
Nishihori et al.

[19]

[11] Patent Number: 6,134,424
[45] Date of Patent: Oct. 17, 2000

[54] HIGH-FREQUENCY POWER AMPLIFIER AND MOBILE COMMUNICATION DEVICE USING SAME

[75] Inventors: Kazuya Nishihori, Tokyo-to; Yoshiaki Kitaura; Mayumi Morizuka, both of Kawasaki; Atsushi Kameyama, Tokyo-to; Masami Nagaoka, Ebina; Hirotsugu Wakimoto, Kawasaki; Tadahiro Sasaki, Tokyo-to, all of Japan

[73] Assignee: Kabushiki Kaisha Toshiba, Kawasaki, Japan

[21] Appl. No.: 08/943,160

[22] Filed: Oct. 3, 1997

[30] Foreign Application Priority Data

| | | | |
|---|---|---|---|
| Oct. 4, 1996 | [JP] | Japan | 8-264012 |
| Mar. 14, 1997 | [JP] | Japan | 9-060878 |
| Jul. 28, 1997 | [JP] | Japan | 9-201153 |

[51] Int. Cl.[7] .......... H01Q 11/12; H01L 31/112; H03F 1/30
[52] U.S. Cl. .......... 455/127; 455/38.3; 257/280; 330/290
[58] Field of Search .......... 455/127, 38.3, 455/574; 257/280, 282, 547, 900, 284; 330/302, 310, 290, 277

[56] References Cited

U.S. PATENT DOCUMENTS

| | | | |
|---|---|---|---|
| 4,510,460 | 4/1985 | Tamura | 330/285 |
| 4,636,822 | 1/1987 | Codella et al. | |
| 4,803,443 | 2/1989 | Takagi et al. | 330/277 |
| 4,803,526 | 2/1989 | Terada et al. | |
| 5,023,569 | 6/1991 | Raven | 330/285 |
| 5,457,427 | 10/1995 | Wong et al. | 330/302 |
| 5,491,450 | 2/1996 | Helms et al. | 330/277 |
| 5,636,243 | 6/1997 | Tanaka | 375/219 |
| 5,724,004 | 3/1998 | Reif et al. | 330/277 |
| 5,796,165 | 8/1998 | Yoshikawa et al. | 257/728 |
| 5,805,023 | 2/1998 | Fukuden | 330/302 |
| 5,986,508 | 11/1999 | Nevin | 330/289 |

FOREIGN PATENT DOCUMENTS

| | | |
|---|---|---|
| 61-55973 | 3/1986 | Japan. |
| 61-101080 | 5/1986 | Japan. |
| 61-110466 | 5/1986 | Japan. |

*Primary Examiner*—Dwayne D. Bost
*Assistant Examiner*—Joy K. Redmon
*Attorney, Agent, or Firm*—Oblon, Spivak, McClelland, Maier & Neustadt, P.C.

[57] ABSTRACT

A MESFET of a GaAs semiconductor device having a p-pocket LDD structure is used for a high-frequency power amplifier of a mobile communication device, in order to decrease current consumption and to increase the continuous operating time of a battery. The high-frequency power amplifier is provided with a gate-bias adjusting feedback element between the drain and gate of the MESFET. Thus, even if there is a great difference between the filled and terminated potentials of the discharge voltage of the battery for supplying electric power to the amplifier, electric power can be supplied near the terminated potential for a long time, so that the mobile communication device can be continuously used for a long time.

14 Claims, 10 Drawing Sheets

HIGH-FREQUENCY POWER AMPLIFIER AND MOBILE COMMUNICATION DEVICE USING SAME

BACKGROUND OF THE INVENTION

The present invention relates generally to a high-frequency power amplifier, which can generate a low distortion and a super power even at a low supply voltage, and a mobile communication device using the same. More specifically, the invention relates to a circuit construction of a high-frequency power amplifier, which can decrease electric power consumption in the circuit and which is operable even if there is a great difference between a filled potential and a terminated potential which are directly supplied from a buttery having the difference between the filled and terminated potentials, a GaAs (gallium arsenide) MESFET (Metal Schottky type Field Effect Transistor) structure, which is used for the high-frequency power amplifier and which is operable even at a low voltage, and a mobile communication device which carries out send and receive using a power amplifier having the GaAs MOSFET structure.

In mobile communication devices, it is of a great commercial value that a continuous talking time defined as a period of time, for which talking can be carried out without exchanging a primary battery or recharging a secondary battery, is long. The supply voltage of a communication device is determined by the type of a battery to be used. Therefore, in order to increase the continuous talking time, it is required to decrease current consumption in circuits of the communication device in addition to the improvement of the battery. In order to accomplish this, it is important to decrease current consumption of a high-frequency power amplifier which has large current consumption in the communication device.

For example, since a simplified portable terminal called a PHS (Personal Handyphone System) has an output power of 0.18 W when the PHS has a high-frequency power amplifier having a power conversion efficiency of 30%, the high-frequency power amplifier has an electric power consumption of 0.6 W (=0.18 W/0.3). Therefore, in a case where a secondary battery of lithium ion having a voltage of 3 V is used as a power supply, the current consumption of the high-frequency power amplifier is 200 mA (=0.6 W/3V). In this case, if the power conversion efficiency of the high-frequency power amplifier is 50%, the current consumption of the high-frequency power amplifier is 120 mA, so that the current consumption of the high-frequency power amplifier can be decreased by 80 mA. This can decrease the current consumption of the whole PHS by about 10% if the current consumption of the whole PHS is about 800 mA. The decreased current consumption directly extend the continuous talking time of the PHS, i.e., a mobile communication device.

Thus, in a mobile communication device, it is important to improve the power conversion efficiency of a high-frequency power amplifier built therein. The power conversion efficiency of the high-frequency power amplifier is almost determined by the power conversion efficiencies of transistors included therein, particularly by the power conversion efficiency of a transistor used at the final stage if the amplifier is a multistage amplifier. A drain efficiency defined as a ratio of output voltage to electric power consumption serves as an index of the power conversion efficiency of a transistor. Therefore, in order to improve the drain efficiency of the transistor, it is important to decrease electric power consumption, i.e., current consumption, of the transistor.

In mobile communication devices having a frequency band of about 1 to 2 GHz called an L band, a high-frequency power amplifier has been realized in the form of a microwave monolithic integrated circuit (which will be hereinafter referred to as a "MMIC"), which is manufactured by forming a metal Schottky type field effect transistor (which will be hereinafter referred to as a "MESFET") formed on a GaAs substrate, together with a plurality of passive elements, on the same semiconductor chip, since it is possible to decrease the size of a terminal.

FIG. 1 is a sectional view of a MESFET used for a conventional high-frequency power amplifier of a mobile communication device. In FIG. 1, the high-frequency power amplifier comprises: a semi-insulating GaAs substrate 1; a high-concentration n-type source region 2 formed on the substrate 1; an intermediate-concentration n-type source region 3, associated with the high-concentration n-type source region 2, for serving as a source; a high-concentration n-type drain region 4 formed on the substrate 1; an intermediate-concentration n-type drain region 5, associated with the high-concentration n-type drain region 4, for serving as a drain; a low-concentration n-type channel 6 formed on the substrate 1 between the intermediate-concentration n-type source region 3 and the intermediate-concentration n-type drain region 5; a Schottky gate electrode 7 of a tungsten nitride, which is formed on the channel 6 and which has a gate length of about 0.8 micrometers; a pair of spacers 8 formed on the side walls of the gate electrode 7; and a p-type buried layer 9 formed between a location beneath the high-concentration n-type source region 2 and a location beneath the high-concentration n-type drain region 4.

In this MESFET, the buried layer 9 can effectively suppress the substrate current between the concentration source and drain regions. In particular, the buried layer 9 can decrease the short channel effect, which is conspicuous when the gate length is about 1 micrometer or less to prevent the mutual conductance from decreasing due to the decreased size of the element.

FIG. 2 shows a portable communication equipment serving as a conventional mobile communication device, which uses the conventional MESFET having the aforementioned construction. In FIG. 2, the conventional mobile communication device 10 comprises: an antenna 11; a switch 12 for switching the receiving and transmitting; a receiver 13 for receiving a high-frequency signal radio-transmitted via the antenna 11 when the switch 12 is in a receiving mode; a synthesizer 14 for superimposing a predetermined frequency signal on a the high-frequency signal received by the receiver 13 to generate a base band signal by the orthogonal demodulation; a base-band signal processing section 15 for processing the generated base band signal; an orthogonal modulator 16 for modulating the base band signal to be transmitted; and a power amplifier 20 for amplifying the generated high-frequency signal.

The mobile communication device 10 further comprises: a secondary battery 18 for supplying a driving voltage to the switch 12, the receiver 13, the synthesizer 14, the base-band signal processing section 15 and the orthogonal modulator 16; and a regulator 19 with a step-up transformer circuit for receiving electric power from the battery 18 to increase the driving voltage to a voltage required for the power amplifier 20. The battery 18 is a lithium (Li) ion battery, which has a filled potential of 3.4 V, a terminated potential of about 2.4 V, and a nominal potential of about 3 V. The battery 18 and the regulator 19 form a power circuit 17.

In the circuits of the mobile communication device 10, the switch 12, the receiver 13, the synthesizer 14, the base-band signal processing section 15 and the orthogonal demodulator 16 are driven at the same potential as the nominal potential of the battery having a supply voltage of about 3 V. On the other hand, since the power amplifier 20 for amplifying a signal intermittently transmitted in a predetermined cycle to a desired value has a supply voltage of about 6 V, the voltage of the battery 18 is increased by means of the step-up transformer circuit in the regulator 19 to operate the power amplifier 20 at a voltage of about 6 V. FIG. 11 shows the relationship between a voltage, which can be supplied from a battery, and supply duration. As shown in FIG. 11, the supply voltage decreases with time, and the power amplifier can not normally operate after time T2. Thus, in the conventional mobile communication device, such as a portable communication equipment, the continuous talking time is limited on the basis of the limitation of the supply voltage of the power amplifier 20. In addition, even in a continuous wait state, in which the function of the power amplifier 20 is not required, electric power is lost in the passive element portions of L, C and R in the step-up transformer circuit and in the switching at the time of dc/ac conversion due to the electric power consumption of the regulator 19 with the step-up transformer circuit provided for the power amplifier, so that there is a problem in that the continuous waiting time must be shorter than that of a communication device which does not have the regulator 19.

There is also a problem in that the size of a portable information terminal can not be decreased due to the volume of a regulator 19 with a step-up transformer circuit for a power amplifier. Moreover, the step-up transformer circuit has a transformer function therein, and converts a DC potential as an alternating current to add the amplitude component thereof to the DC: component to increase the DC voltage. Therefore, there are a lot of possibilities that the built-in transformer section serves as a noise source, and the measures to remove noises must be taken in the receiving section, so that there are problems in that the mounting is complicated and the housing volume is increased.

A conventional power amplifier circuit for a PHS, which uses the time division multiple access/time division demultiple (which will be hereinafter referred to as "TDMA/TDD") system, has a function of amplifying a signal, which is intermittently transmitted in a predetermined cycle, e.g., at a frequency of 1.9 GHz, to a desired value. In this type of conventional amplifier circuit, the linearity is regarded as important, so that the class A or AB amplification is used. FIG. 3 shows the circuit construction of a conventional power amplifier 20. In FIG. 3, the power amplifier 20 comprises: matching circuits 21 and 22; and a MESFET 23, the gate of which is connected to the matching circuit 21 and the drain of which is connected to the power circuit 17, the matching circuit 22 being connected to the connecting point of the power circuit 17 with the drain of the MESFET 23. In this case, the relationship between the drain current Id and the drain voltages Vd and the load line are shown in FIG. 4. As can be clearly seen from FIG. 4, as the drain voltage decreases while the gate bias voltage is constant, the distortion is great and the output power decreases. Therefore, if the supply voltage applied to the power amplifier decreases, the power amplifier can not be used due to the lowering of the linearity and the decreasing of the output power, so that there is a problem in that the talking time is restricted.

As one of the materials of semiconductor devices for power amplifiers, GaAs (gallium arsenide) has been used in view of the characteristics at high frequencies in the L band. This GaAs (gallium arsenide) MESFET has used a BPLDD (Buried P-layer Lightly Doped Drain) structure, which has superior characteristics particularly at high frequencies and which has a good reliability of process. FIG. 5 shows the relationship between the drain current Id and the drain voltage Vd in the BPLDD structure. As can be clearly seen from this characteristic, there is an influence of the distortion near the breakdown when the drain voltage is high, and there is an influence of the distortion near the knee voltage when the drain voltage is low. Therefore, there is a problem in that the linearity may deteriorate or the output voltage may decrease by a method of drawing the load line, so that a sufficient output can be obtained.

As described above, as one of the MESFETs forming a high-frequency power amplifier for a mobile communication device, although the MESFET with the buried layer (which will be hereinafter referred to as a "buried-layer type MESFET") has superior advantages, it is expected to improve the buried-layer type MESFET so as to increase the continuous talking time of the mobile communication device and so as to decrease the electric power consumption of the high-frequency power amplifier built in the mobile communication device. On the other hand, it has been found by the inventors' recent research that, if the buried-layer type MESFET is used for a high-frequency amplifier of a mobile communication device, useless current consumption is caused by kinks. Due to this useless current consumption, the decreasing of the current consumption is insufficient in the conventional high-frequency power amplifier using the buried-layer type MESFET, so that there is a problem in that it is not possible to increase the continuous talking time in the mobile communication device including the aforementioned high-frequency power amplifier.

In general, in the saturated region of the MESFET, the drain current is maintained to be constant with respect to the drain voltage. The term "kink" means that the drain current is temporarily increased. This kink appears as a peak of drain conductance. It has been reported by the computer simulation that such a kink appears in the buried-layer type MESFET, and it is considered that the kink is caused by the accumulation of holes, which are generated by the impact ionization, in a buried layer beneath a channel. FIG. 9 is a graph showing the relationship between the maximum drain voltage applied to a drain terminal when the MESFET is operated by a large-signal, and the DC component of the drain current (i.e., current consumption). Furthermore, this graph shows the characteristic when the π/4QPSK modulation is carried out at a supply voltage of 3 V at a local oscillation frequency of 1.9 MHz. In FIG. 9, the curve plotted by signs □ shows the characteristic of the buried-layer type MESFET shown in FIG. 1. It can be found by this characteristic drawing that, in the buried-layer type MESFET, although the maximum drain voltage increases as the input power increases, the current consumption increases rapidly at a maximum drain voltage of about 5 V. This is related to the presence of kink near the aforementioned voltage. The current consumption due to the kink is insignificant for the operation of the high-frequency power amplifier, and this causes to inhibit the continuous talking time of the mobile communication device including the high-frequency power amplifier from increasing.

It is therefore an object of the present invention to eliminate the aforementioned problems and to provide a high-frequency power amplifier having small electric power consumption, and a mobile communication device having a long continuous talking time.

In the mobile communication device, such as a portable communication equipment, as described above, there is a difference between a filled potential and a terminated potential of a chargeable battery. Therefore, there are problems in that a power amplifier, which operates at a relatively high voltage in the circuits used in the communication equipment, can not operate at a voltage of not higher than a reference voltage, so that the continuous talking time and the continuous waiting time are restricted.

It is therefore another object of the present invention to eliminate the aforementioned problems and to provide a high-frequency power amplifier, which can increase the continuous talking time and the continuous waiting time even if there is a great difference between the filled and terminated potentials of a battery in a portable communication equipment, and which can operate at a low supply voltage, and a mobile communication device using the same.

SUMMARY OF THE INVENTION

In order to accomplish the aforementioned and other objects, according to one aspect of the present invention, a high-frequency power amplifier comprises: a signal input terminal for inputting an input signal; a signal output terminal for outputting an output signal; a plurality of stages of field effect transistors, which are connected to each other via an interstage matching circuit provided between a front-stage drain and a rear-stage gate, a reference potential being supplied to each of sources of the field effect transistors, and a supply voltage being supplied to each of drains of the field effect transistors; an input matching circuit provided between the signal input terminal and a gate of a first-stage field effect transistor which is one of the field effect transistors; and an output matching circuit provided between a drain of a final-stage field effect transistor, which is one of the field effect transistors, and the signal output terminal, at least the final-stage field effect transistor out of the plurality of stages of field effect transistors comprising: a semi-insulating substrate; a first conducting type of channel region provided on the substrate; a gate electrode, which is provided on the channel region and which has a Schottky junction between the substrate and the gate electrode; a first conducting type of source and drain regions, which are provided on the substrate via the channel region so as to be apart from each other; and a second conducting type of region, which is provided near the channel region of at least one of the source and drain regions and which contacts only one of the source and drain regions.

Preferably, at least one of the source and drain regions has a first region contacting the channel region, and a second region, which is apart from the channel region and which contacts the first region, and the first region has a lower impurity concentration than that of the second region. The second conducting type of region is preferably provided beneath the first region.

According to another aspect of the present invention, a high-frequency power amplifier comprises: a signal input terminal for inputting an input signal; a signal output terminal for outputting an output signal; a plurality of stages of field effect transistors, which are connected to each other via an interstage matching circuit provided between a front-stage drain and a rear-stage gate, a reference potential being supplied to each of sources of the field effect transistors, and a supply voltage being supplied to each of drains of the field effect transistors; an input matching circuit provided between the signal input terminal and a gate of a first-stage field effect transistor which is one of the field effect transistors; and an output matching circuit provided between a drain of a final-stage field effect transistor, which is one of the field effect transistors, and the signal output terminal, at least the final-stage field effect transistor out of the plurality of stages of field effect transistors comprising: a semi-insulating substrate; a first conducting type of channel region provided on the substrate; a gate electrode, which is provided on the channel region and which has a Schottky junction between the substrate and the gate electrode; a pair of first regions of a first conducting type formed on the substrate so as to be self-aligned with the gate electrode; a pair of regions of a second conducting type formed beneath the first region so as to be self-aligned with the gate electrode; a pair of spacers formed on side walls of the gate electrode; and a pair of second regions of a first conducting type, which are formed on the substrate so as to be self-aligned with the gate electrode and the spacers and which have a higher impurity concentration than that of the first region, the pair of second regions being associated with the pair of first regions for serving as source and drain regions, respectively.

The regions of the second conducting type are preferably depleted by a built-in potential formed between the source or drain region and the regions of the second conducting type.

According to another aspect of the present invention, a mobile communication device comprises: an antenna; a high-frequency receiving circuit for demodulating a signal received by the antenna; a modulator circuit for modulating a signal to be transmitted from the antenna; and a high-frequency power amplifier for amplifying an output of the modulator circuit to output the amplified output to the antenna, the high-frequency power amplifier having the same structure as that of the aforementioned high-frequency power amplifier.

According to another aspect of the present invention, there is provided a high-frequency power amplifier, which is connected to a battery having a difference between a filled potential and a terminated potential, for receiving a high-frequency signal, which is intermittently transmitted in a predetermined cycle, to amplify the high-frequency signal to a desired value, the high-frequency power amplifier comprising: a MESFET, which has a gate connected to a front-stage impedance matching circuit, and a drain connected to the battery and a rear-stage impedance matching circuit; gate bias means, connected between the battery and the drain, for detecting a gate bias based on a potential between the filled potential and the terminated potential of the battery; and feedback means for causing the gate bias of the MESFET to be variable so as to maintain an output power at a desired value by supplying the gate bias detected by the gate bias means to the front-stage impedance matching circuit.

In this high-frequency power amplifier, a relatively low voltage of 2 V to 1 V may be supplied to the drain, and an output power of the desired value can be supplied even if the terminated potential of the battery is the relatively low voltage.

According to another aspect of the present invention, a mobile communication device comprises: an antenna for transmitting and receiving a high-frequency power; a high-frequency receiving circuit for demodulating the high-frequency power received by the antenna; a modulator circuit for modulating a signal to be transmitted from the antenna; and a high-frequency power amplifier for amplifying an output of the modulator circuit to output the amplified output to the antenna, the high-frequency power amplifier being connected to a battery having a difference between a filled potential and a terminated potential, for receiving a high-frequency signal, which is intermittently transmitted in a predetermined cycle, to amplify the high-frequency signal to a desired value, and the high-frequency power amplifier comprising: a MESFET, which has a gate connected to a front-stage impedance matching circuit, and a drain connected to the battery and a rear-stage impedance matching circuit; gate bias means, connected between the battery and the drain, for detecting a gate bias based on a potential between the filled potential and the terminated potential of the battery; and feedback means for causing the gate bias of the MESFET to be variable so as to maintain an output power at a desired value by supplying the gate bias detected by the gate bias means to the front-stage impedance matching circuit.

In this mobile communication device, an amplifying power of a relatively low voltage may be directly supplied from a battery of a low supply voltage by causing the gate bias of the MESFET to be variable, without providing a step-up or step-down transformer circuit function in a power supply circuit containing at least the battery.

According to further aspect of the present invention, there is provided a high-frequency power amplifier comprising a field effect transistor having: a grounded source; a gate, to which a high-frequency input signal is supplied and which is connected, via a high-resistance, to a terminal for supplying a dc potential; and a drain, which outputs a high-frequency signal and which is connected to a high-potential power supply via an inductance element, the field effect transistor comprising: a semi-insulating substrate; a first conducting type of channel region provided on the substrate; a gate electrode, which is provided on the channel region and which has a Schottky junction between the substrate and the gate electrode; a first conducting type of source and drain regions, which are provided on the substrate via the channel region so as to be apart from each other; and a second conducting type of region, which is provided near the channel region of at least one of the source and drain regions and which contacts only one of the source and drain regions, and the field effect transistor having a supply voltage of 2.4 V or less, and a dc potential of 0 V or more is supplied to the gate electrode.

The high-frequency power amplifier may comprise a plurality of stages of unit power amplifiers, and wherein at least a final-stage unit power amplifier has the field effect transistor.

According to still further aspect of the present invention, a mobile communication device comprises: an antenna; a high-frequency receiving circuit for demodulating a signal received by the antenna; a modulator circuit for modulating a signal to be transmitted from the antenna; and a high-frequency power amplifier for amplifying an output of the modulator circuit to output the amplified output to the antenna, the high-frequency power amplifier having the same construction as that of the aforementioned high-frequency power amplifier.

According to such a high-frequency power amplifier of the present invention, it is possible to prevent holes from accumulating beneath a channel so as to prevent kinks from being produced, since there is no p-layer beneath the channel region in the final-stage MESFET out of the plurality of stages of MESFETs. Therefore, according to the present invention, it is possible to greatly improve the drain efficiency of the final-stage MESFET of the high-frequency power amplifier, so that it is possible to provide a high-frequency power amplifier having a higher power conversion efficiency than those of conventional high-frequency power amplifiers. According to the mobile communication device using the high-frequency power amplifier having a high power conversion efficiency, it is possible to extend the continuous talking time.

According to the present invention, the power amplifier is connected to a battery having a difference between the filled and terminated potentials thereof to amplify a signal intermittently transmitted in a predetermined cycle to a desired value, and a potential between the filled and terminated potentials of the battery is supplied to the power amplifier. In order to maintain the output power of the power amplifier at a desired value, the gate bias of the power amplifier is variable.

According to the present invention, the power amplifier has a device structure, which can output a desired output power at all the potentials of a battery between the filled and terminated potentials thereof even if the voltage of the battery decreases with time, and which can operate at a low voltage of, e.g., 2 V or less.

According to the present invention, there is used a power amplifier, to which a relatively low voltage is supplied directly from a battery of a low supply voltage without the need of a step-up or step-down transformer circuit function or which amplifies a signal intermittently transmitted in a predetermined cycle to a desired value. According to the present invention, a mobile communication device includes a receiver, to which a relatively low potential being the same as that of the power amplifier is supplied, a synthesizer, a base-band signal processing section, an orthogonal modulator and a switch. The mobile communication device can use a Ni-hydrogen battery for supplying a nominal voltage of 1.2 V to 2.4 V as a battery of a low supply voltage without the need of a step-up transformer circuit.

As described above, according to the present invention, it is possible to provide a high-frequency power amplifier, which has a high power conversion efficiency and small current consumption, and a mobile communication device, which can increase the continuous talking time using the high-frequency power amplifier having small current consumption.

In addition, according to the present invention, it is possible to provide a power amplifier circuit which can stably operate even if there is a great difference between the filled and terminated potentials which are directly supplied from a battery. In addition, since the power amplifier can operate at a relatively low supply voltage, the continuous talking time and the continuous waiting time can be extended, and the number of parts can be decreased, so that the size of the system can decreased.

Moreover, according to the present invention, since it is possible to realize a high-frequency power amplifier which can obtain a sufficiently linear electric power even if the supply voltage is decreased, it is possible to decrease electric power consumption of a portable terminal such as a PHS.

DESCRIPTION OF THE PREFERRED EMBODIMENTS

Referring now to the accompanying drawings, the preferred embodiments of a high-frequency amplifier circuit and a mobile communication device using the same, according to the present invention, will be described in detail below.

Figure 6:
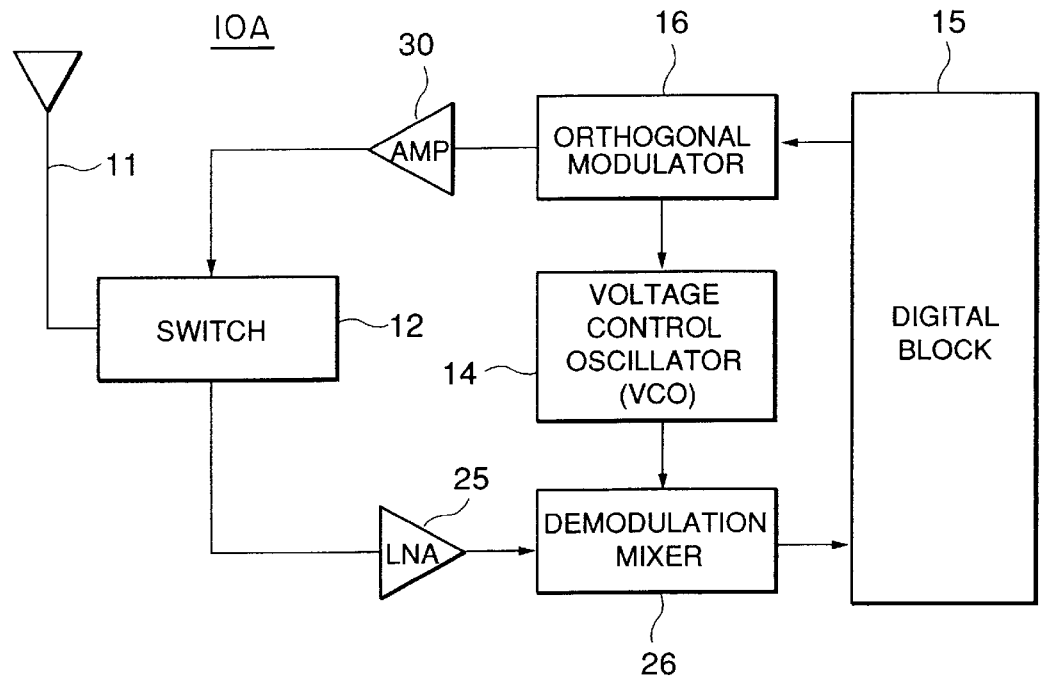
FIG. 6 is a block diagram of the first preferred embodiment of a mobile communication device according to the present invention.

FIG. 6 is a block diagram of a principal part of the first preferred embodiment of a mobile communication device according to the present invention. In FIG. 6, a mobile communication device 10A comprises: an antenna 11; a switch 12 for switching a high-frequency signal transmitted and received via the antenna 11; a low noise amplifier (LNA) 25; a modulation mixer 16 serving as an orthogonal modulator; a digital block 15 serving as a base-band signal processing section; a voltage control oscillator (VCO) 14 serving as a synthesizer; a demodulation mixer 26; and a high-frequency amplifier 30.

When the transmission is carried out, the digital block 15 converts an analog signal, which is inputted from a microphone (not shown) or the like to be transmitted, into a digital signal and compresses the band of the digital signal by the signal processing technique. When the receiving is carried out, the digital block 15 extends the band of the received digital signal by the signal processing technique and converts the extended digital signal into an analog signal to output a signal for driving a speaker (not shown).

The mixer 16 for modulating a signal to be transmitted carries out the π/4 shift QPSK modulation and so forth of the digital signal, which is inputted from the digital block 15 to be band-compressed, using a local oscillation signal of 1.9 MHz outputted from the voltage control oscillator 14, and outputs the modulated output to the high-frequency power amplifier 30 which is realized as a microwave monolithic integrated circuit (MMIC). The signal amplified to a sending power by the high-frequency power amplifier 30 is propagated to the antenna 11 via the switch 12 for switching the transmission and receiving, and the propagated signal is amplified by the antenna 11 to be transmitted.

On the other hand, when the receiving is carried out, the signal received by the antenna 11 is inputted to the low noise amplifier 25 via the switch 12, and amplified to a desired signal level by the low noise amplifier 25 to be outputted to the demodulation mixer 26. The demodulation mixer 26 detects and demodulates the received signal using the local oscillation signal outputted from the voltage control oscillator 14 to output the demodulated signal to the digital block 15.

Furthermore, the mobile communication device also has a keyboard for keying, and a power circuit having a primary battery or a secondary battery as a power supply, which are not shown in FIG. 6. In this preferred embodiment, although the high-frequency power amplifier 30 is realized by the MMIC, the switch 12, the low noise amplifier 25 and so forth may be mounted on the MMIC to be formed as an integrated circuit.

Figure 7:
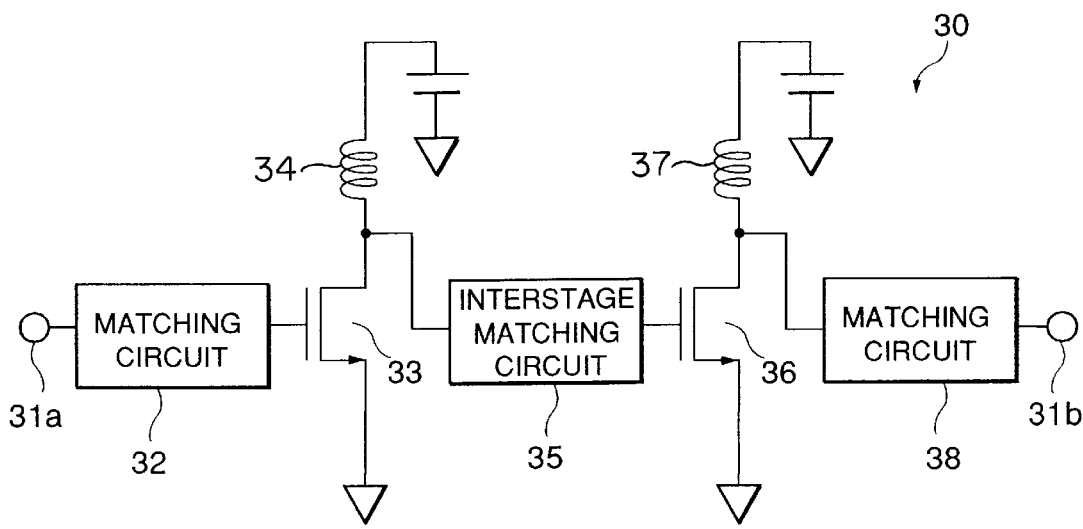
FIG. 7 is a circuit diagram of the first preferred embodiment of a high-frequency power amplifier according to the present invention.

FIG. 7 is a circuit diagram showing the detail of the high-frequency power amplifier 30. The transmitted signal modulated by the mixer 16 is supplied to an input terminal 31a. This transmitted signal is supplied to the gate of a front-stage MESFET 33 via a well-known impedance matching circuit 32 for impedance matching. The source of the MESFET 33 is grounded, and a supply potential of, e.g., 3 V, is supplied to the drain of the MESFET 33 via a choke coil 34. Furthermore, this supply potential corresponds to a supply voltage of, e.g., a lithium ion secondary battery, mounted in the mobile communication device. The drain of the MESFET 33 is connected to the gate of a rear-stage MESFET 36 via a well-known interstage matching circuit 35 for impedance matching between the front and rear stages. Similar to the MESFET 33, the source of the MESFET 36 is grounded, and a supply potential is supplied to the drain thereof via a choke coil 37. The drain of the rear-stage MESFET 36 is also connected to an output terminal 31b, which is connected to the switch 12, via a well-known impedance matching circuit 38 for impedance matching.

While the high-frequency power amplifier 30 has comprised the two-stages of MESFETs 33 and 36 in FIG. 7, it may comprise three or more stages of MESFETs, if necessary. In that case, between the drain of the front-stage MESFET 33 and the gate of the rear-stage MESFET 36, the gates of desired numbers of MESFETs may be connected to the drain of the directly upstream MESFET. In addition, an interstage matching circuit may be provided between the drain of the directly upstream MESFET and the gate of the additional MESFET, if necessary.

Figure 1:
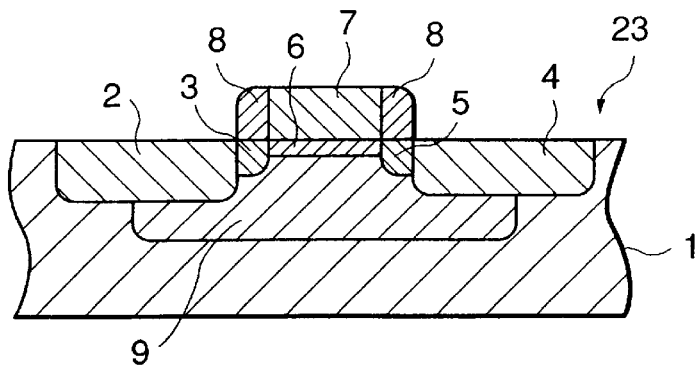
FIG. 1 is a sectional view of a MESFET for use in a conventional high-frequency power amplifier.
Figure 2:
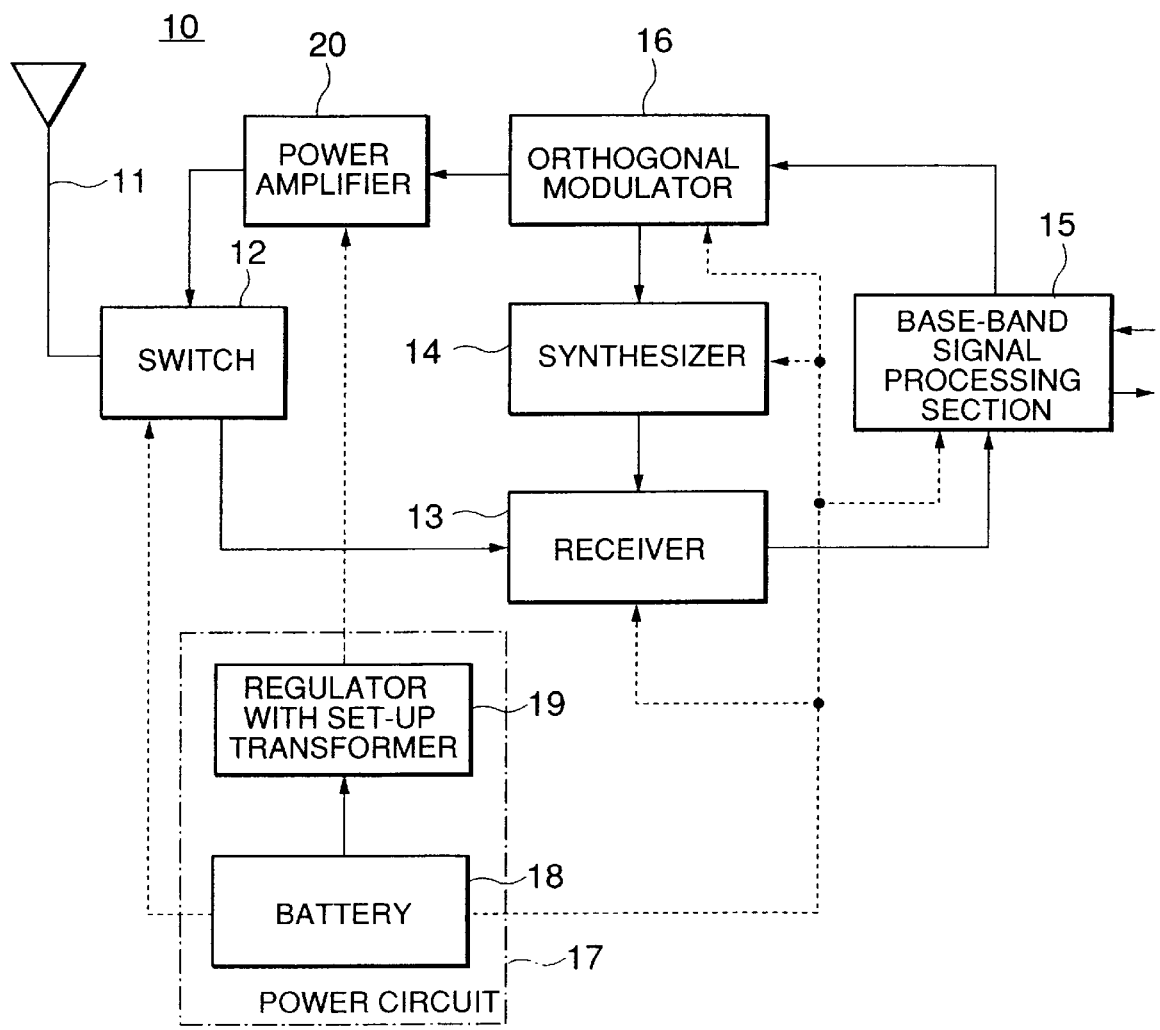
FIG. 2 is a block diagram of a conventional mobile communication device.
Figure 8:
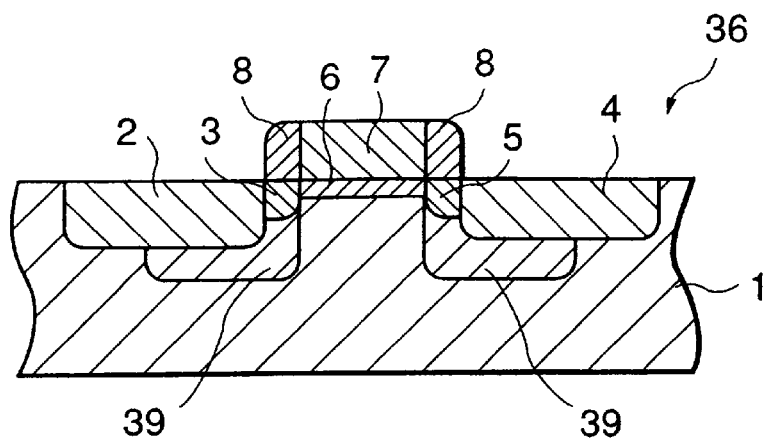
FIG. 8 is a sectional view of a MESFET for use in the first preferred embodiment of a high-frequency power amplifier according to the present invention.

Referring to FIG. 8, the structure of the rear-stage MESFET 36 will be described below. In FIG. 8, the same reference numbers are used for the same elements as or similar elements to the conventional MESFET 23 shown in FIG. 1.

In FIG. 8, the MESFET 36 comprises: a semi-insulating GaAs (gallium arsenide) substrate 1; a high-concentration n-type source region 2; an intermediate-concentration n-type source region 3, associated with the high-concentration n-type source region 2, for serving as a source; a high-concentration n-type drain region 4; an intermediate-concentration n-type drain region 5, associated with the high-concentration n-type drain region 4, for serving as a drain; a low-concentration n-type channel 6; a Schottky gate electrode 7 of a tungsten nitride having a gate length of about 0.8 micrometers; and a pair of spacers 8 formed on the side walls of the gate electrode 7.

In the MESFET 36 shown in FIG. 8, no buried layer is formed beneath the channel 6, and two separate p-type regions 39, one of which contacts only the source and the other of which contacts only the drain, are buried. At this point, the MESFET 36 shown in FIG. 8 is different from the buried-layer type MESFET 23 shown in FIG. 1. In this structure, the intermediate-concentration n-type source region 3, the intermediate-concentration n-type drain region 5, and the p-type regions 39 are formed so as to be self-aligned with respect to the gate electrode 7, and the high-concentration n-type source region 2 and the high-concentration n-type drain region 4 are formed so as to be self-aligned with respect to the gate electrode 7 and the spacers 8.

Figure 9:
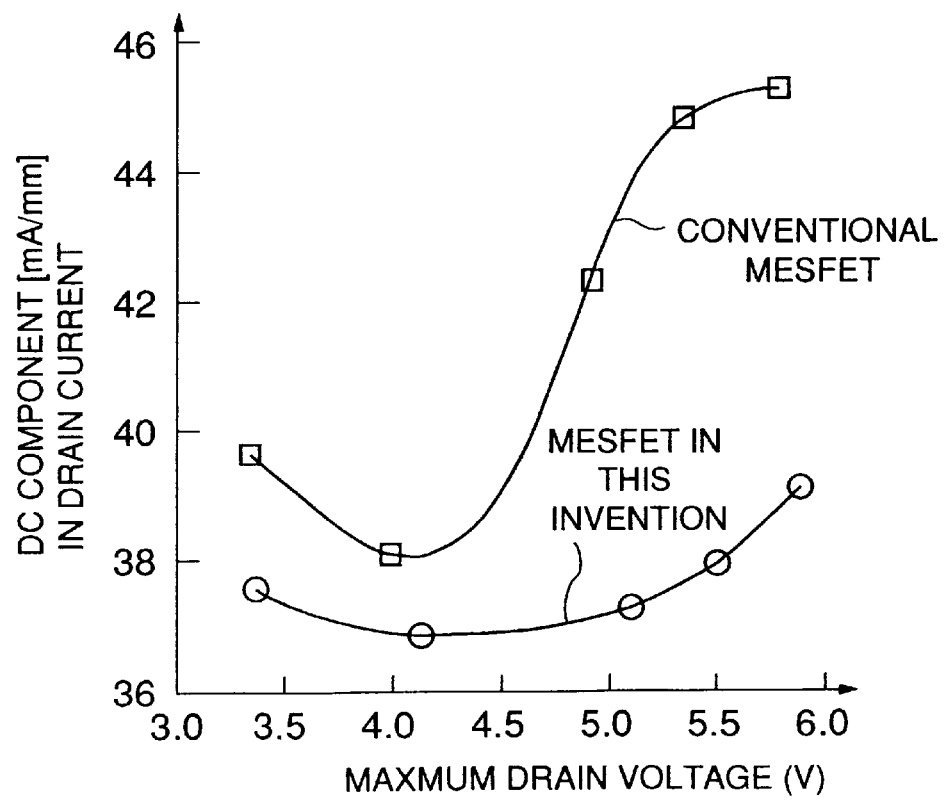
FIG. 9 is a graph showing the characteristic of a MESFET for use in the first preferred embodiment of a high-frequency power amplifier according to the present invention, and the characteristic of a MESFET for use in a conventional high-frequency amplifier.

According to this structure, since no p-type region exists beneath the channel, no hole accumulates therein and no kink is caused therein, so that: it is possible to greatly improve the drain efficiency in comparison with the conventional structure. This can be clearly seen from the graph of FIG. 9. In FIG. 9, the curve plotted by signs ○ shows the characteristic of the MESFET shown in FIG. 8. Thus, it is possible to improve the drain efficiency of the final-stage (the second-stage) transistor having large current consumption, so that it is possible to decrease the current consumption of the whole high-frequency power amplifier. According to the inventors' experiments, the drain efficiency of the MESFET shown in FIG. 8 is about 50%, and remarkably increased in comparison with the conventional buried-layer type MESFET shown in FIG. 1, which has a drain efficiency of about 30%. As a result, the current consumption of the high-frequency power amplifier shown in FIG. 7 is decreased from 200 mA to 150 mA. Thus, the continuous talking time of the mobile communication device shown in FIG. 6 can be extended by about 10% as described above.

In the structure of FIG. 8, the impurity concentration of the p-type region 39 may be set so that carriers (positive holes) are completely depleted by the built-in potential of the p-n junction. If the concentration is further increased, the advantage of decreasing the substrate current is saturated, and the parasitic capacity is increased to deteriorate the performance. In addition, the MESFET 36 shown in FIG. 8 has the intermediate-concentration regions 3 and 5. It has been found that the substrate current can be decreased by providing the intermediate-concentration regions 3 and 5.

Moreover, the intermediate-concentration regions may be provided only on the source side without being provided on the drain side, and the channel region may extend from the end of the gate electrode by about 0.3 micrometers corresponding to the width of the spacer to be connected to the high-concentration drain region. Thus, it is possible to improve the drain's withstand voltage of the MESFET. In this case, although the parasitic resistance of the drain side increases, there is no problem since the source resistance is important in the operations of transistors of a high-frequency power amplifier.

Figure 3:
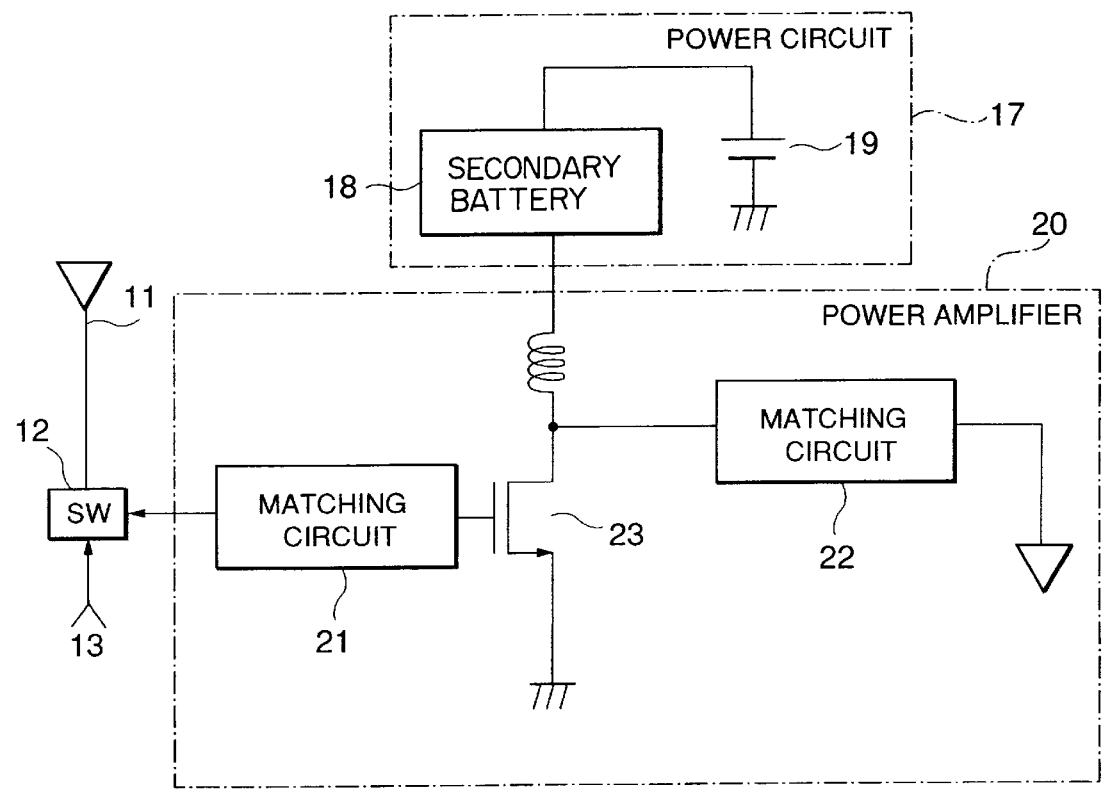
FIG. 3 is a block diagram of a conventional high-frequency power amplifier.
Figure 4:
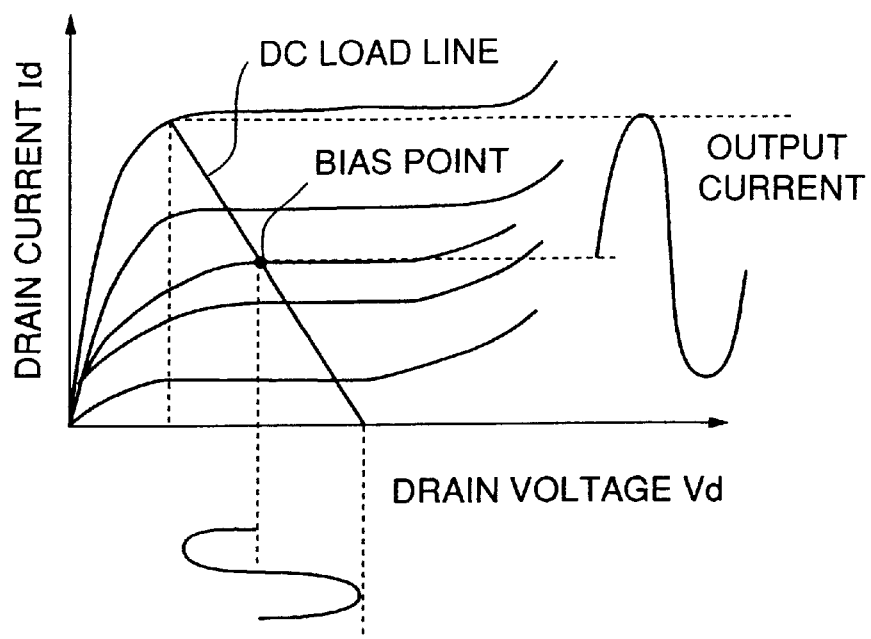
FIG. 4 is a graph showing the relationship between the drain current and the drain voltage in a conventional MESFET.
Figure 5:
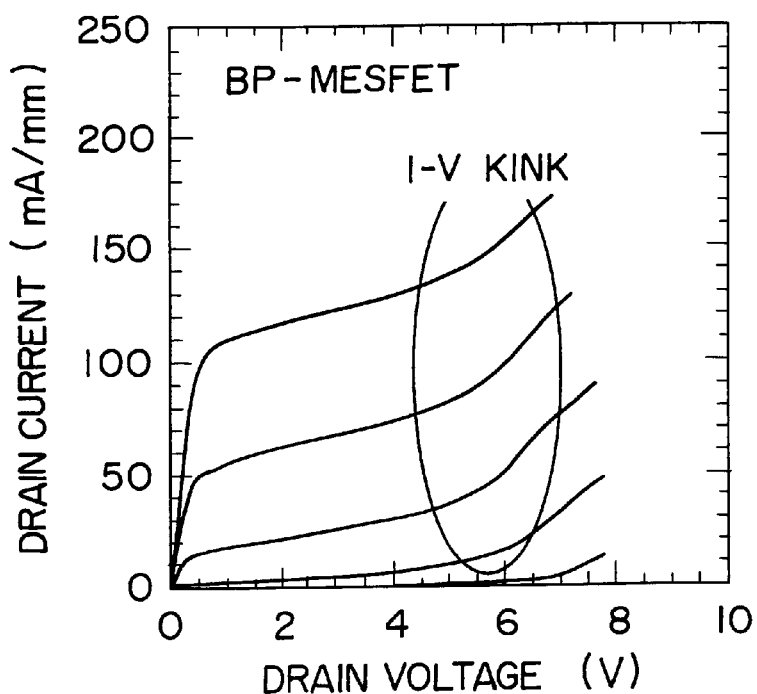
FIG. 5 is a graph showing the relationship between the drain current and the drain voltage in a conventional MES-FET.

In this preferred embodiment, while the MESFET in the final stage (the second stage) of the high-frequency amplifier having the multistage MESFETs has been constructed as shown in FIG. 8, it is not always required to adopt the structure of FIG. 3, since the current consumption of the MESFET(s) other than that in the final stage is small. It is rather desired to regard the gain of the whole high-frequency power amplifier as important to use the buried-layer type MESFET shown in FIG. 1. Thus, if the transistor MESFETs in the power amplifier are selectively used, it is possible to provide a high-frequency power amplifier having low electric power consumption and a high gain.

Referring to FIGS. 10 through 13, the second preferred embodiment of a high-frequency amplifier, according to the present invention, will be described below.

Figure 10:
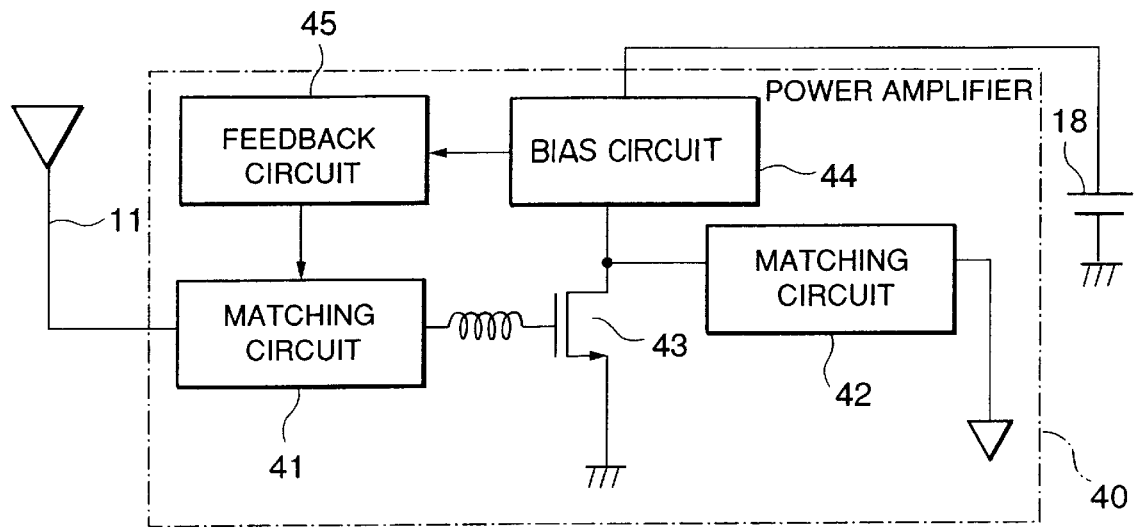
FIG. 10 is a block diagram of the second preferred embodiment of a high-frequency power amplifier according to the present invention.
Figure 11:
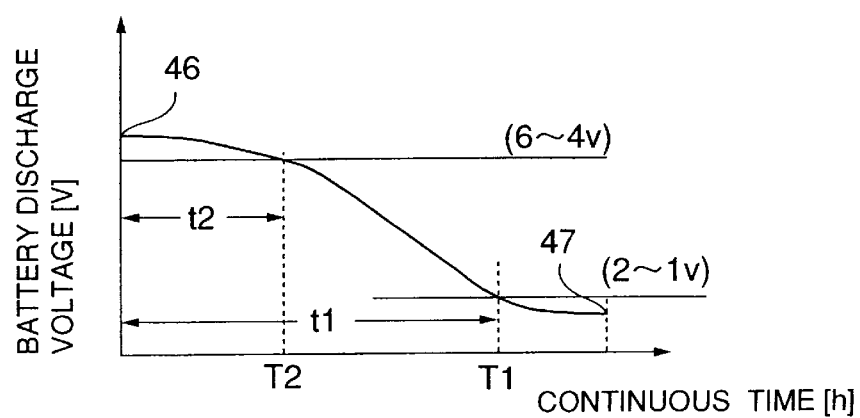
FIG. 11 is a graph showing the relationship between the discharge potential of a battery and the continuous talking time in a high-frequency power amplifier according to the present invention, in comparison with the relationship in a conventional high-frequency power amplifier.

FIG. 10 shows the second preferred embodiment of a high-frequency amplifier (power amplifier) according to the present invention. In FIG. 10, a power amplifier 40 comprises: an impedance matching circuit 41 on the side of an antenna 11; an impedance matching circuit 42 on the base band side; a MESFET 43, the gate of which is connected to the matching circuit 41 and the drain of which is connected to the matching circuit 42; a bias circuit 44 provided between at a secondary battery 18; and a feedback circuit 45 for fluctuating a gate voltage of the MESFET 43 by the output of the gate bias circuit 44 in accordance with the difference of the fluctuated drain voltages of the MESFET 43. With this construction, even if the power amplifier is connected to the battery 18 having a difference between a filled potential and a terminated potential, and even if a potential gradually decreasing from the filled potential to the terminated potential is supplied by the power amplifier of the present invention which amplifies the signal intermittently transmitted in a predetermined cycle to a predetermined value, it is possible to fluctuate the gate bias point by the feedback circuit 45 and the bias circuit 44 in accordance with the difference of the fluctuated drain voltages to maintain the output power of the power amplifier and the linearity thereof at a desired value. As a result, it is possible to prevent the linearity and the output power from remarkably decreasing due to a great difference between the filled potential 46 and the terminated potential 47 of the battery 18 as shown in FIG. 11 and due to a constant gate bias, such as a gate bias of the conventional power amplifier circuit. It is also possible to extend the duration t2 until the continuous talking time T2 in the conventional portable communication equipment, to the duration t1 until the continuous talking time T1 according to the present invention. As a result, it is possible to decrease a drain voltage of 6 V to 4 V, which is required for the power supply for a conventional power amplifier, to a drain voltage of 2 V to 1 V, so that it is possible to decrease the electric power consumption and it is also possible to decrease the size of the battery if the continuous talking time is substantially the same as the conventional continuous talking time, so that it is possible to improve the portability.

Figure 12:
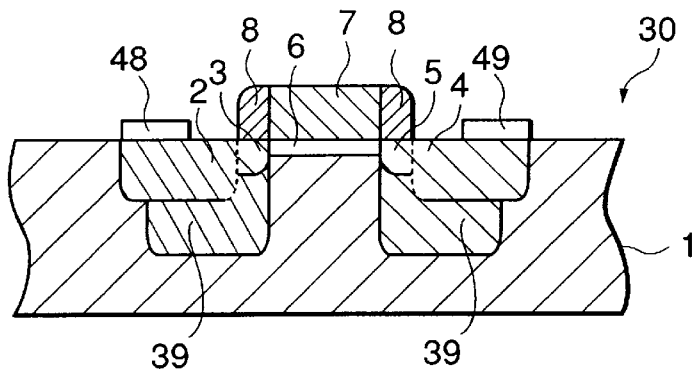
FIG. 12 a sectional view of a MESFET for use in the second preferred embodiment of a high-frequency power amplifier according to the present invention.

FIG. 12 shows a FET structure of a semiconductor device for a power amplifier according to the present invention, to which the same battery is connected and which can output a desired electric power in all the potentials between the filled potential and the terminated potential of the battery. The structure of FIG. 12 is substantially the same as the structure of the semiconductor device 36 shown in FIG. 8, except that a source contact 48 is provided on a high-concentration source region 2 of a MESFET 43 and that a drain contact 49 is provided on a high-concentration drain region 4. With this construction, it is possible to maintain the linearity and the output power even at a relatively low voltage of 2 V or less.

Figure 13:
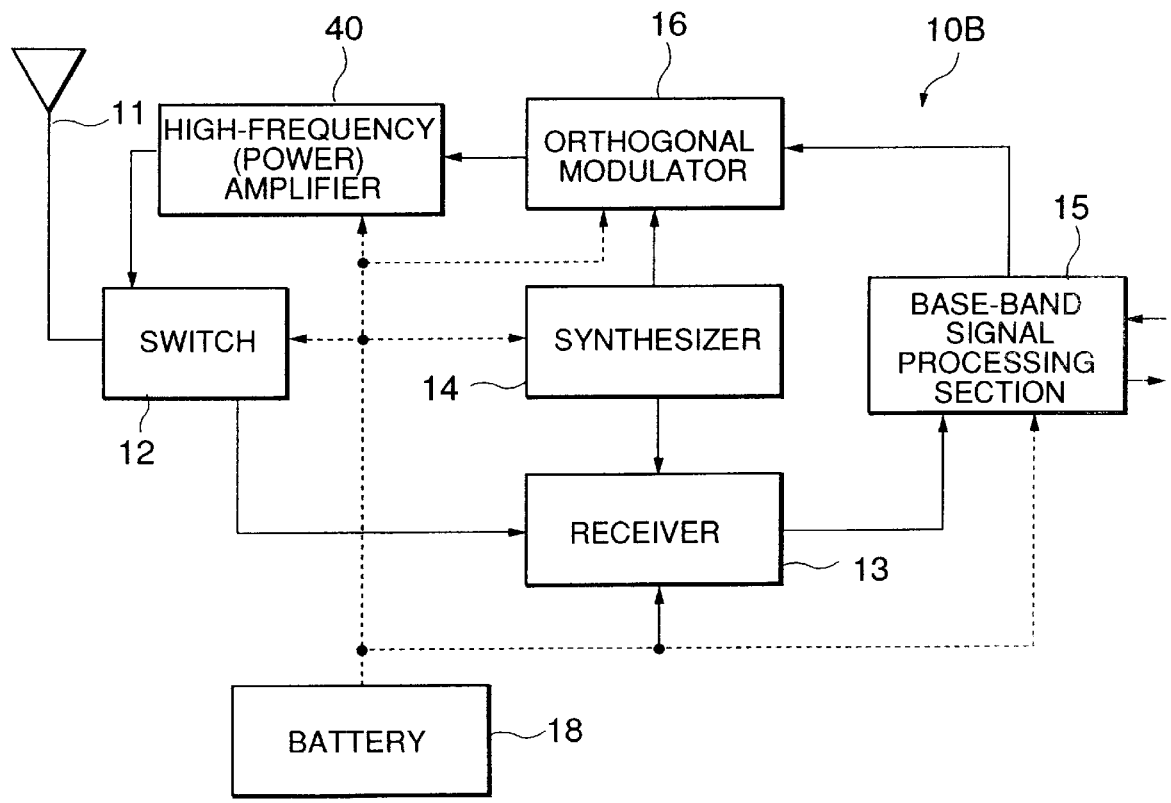
FIG. 13 is a block diagram of the second preferred embodiment of a mobile communication device according to the present invention.

FIG. 13 shows a portable communication equipment serving as a mobile communication device, which uses the second preferred embodiment of the high-frequency amplifier (power amplifier) 40 of FIG. 10 and the MESFET 43 shown in FIG. 12 as a device structure of the power amplifier 40. In FIG. 13, the second preferred embodiment of a portable communication equipment 10B, according to the present invention, comprises: a power amplifier 40 for amplifying a signal, which is intermittently transmitted in a predetermined cycle, to a desired value without the need of a step-up or step-down transformer function in a regulator for a secondary battery 18 unlike conventional regulators; a receiver 13, to which a relatively low potential being the same as the potential of the power amplifier 40 is supplied; a synthesizer 14; a base-band signal processing section 15; an orthogonal modulator 16; and a switch 12, and uses a low supply voltage battery 18 which is a nickel (Ni)-hydrogen battery for supplying a nominal voltage of 1.2 V to 2.4 V.

In conventional power amplifiers, if two lithium (Li) ion batteries, each of which has a voltage of 3.4 V, are connected in series so as to have a nominal voltage of 6 V, or if a lithium (Li) ion battery having a nominal voltage of 3 V is used, the service capacity is about 500 mA/h. On the other hand, if the second preferred embodiment of the high-frequency amplifier 40 is used, the effects of the low supply voltage thereof are as follows. That is, in a case where two nickel (Ni)-hydrogen batteries, each of which has a voltage of 1.2 V, are used, the service capacity of one battery can be increased to be 2000 mA/h, so that it is possible to extend the continuous talking time of the portable communication equipment. In addition, since no electric power is consumed by a regulator with a step-up transformer circuit unlike conventional regulators and since the supply voltage can be uniformly set to be 2 V or less, it is possible to extend the continuous waiting time when the power amplifier is not used.

In addition, since it is not required to provide any step-up transformer circuits in the regulator, it is possible to remove the problems in conventional step-up transformer circuits, i.e., the power loss of the passive element portions of L, C and R and the power loss in the switching at the time of dc/ac conversion, so that the effect of low power consumption is great. The step-up transformer circuit in the conventional regulator has a transformer function therein, and converts a DC potential in the form of alternating current to add an amplitude component to the DC component to increase the DC potential. However, there is a great possibility that such a built-in transformer portion serves as a noise source, and it is required to remove noises in the receiving section, so that there are problems in that the mounting is complicated and the size thereof is increased. The second preferred embodiment of a high-frequency amplifier, according to the present invention, can also eliminate such problems.

Referring to FIGS. 14 through 18, the third preferred embodiment of a high-frequency power amplifier, according to the present invention, will be described below.

Figure 14:
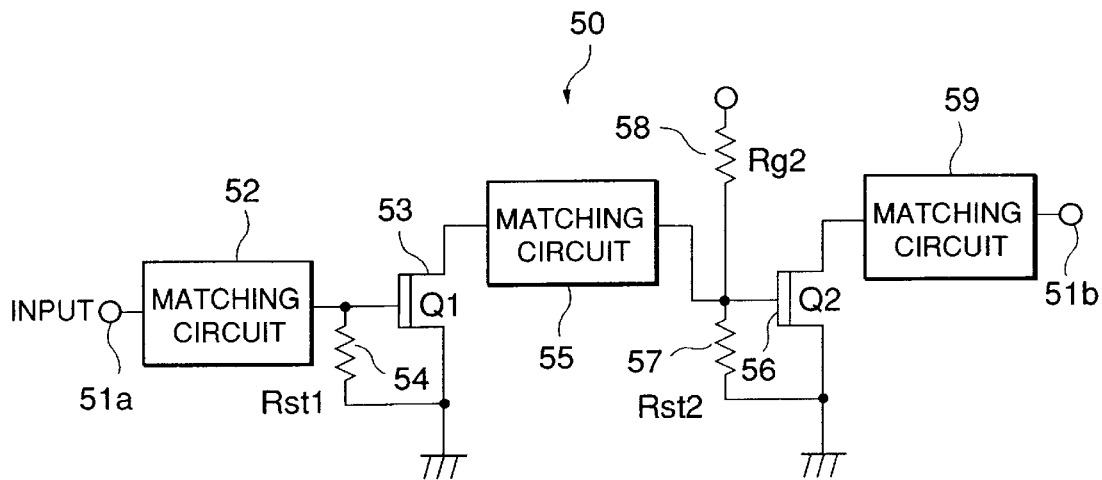
FIG. 14 is a block diagram of the third preferred embodiment of a high-frequency power amplifier according to the present invention.

As shown in FIG. 14, the third preferred embodiment of a high-frequency power amplifier 50, according to the present invention, comprises: FETs 53 and 56, which are arranged at two stages between an input terminal 51a and an output terminal 51b and the sources of which are grounded; and matching circuits 52, 55 and 59 which are arranged at three stages. The three stages of matching circuits comprise: an input matching circuit 52 provided between the input terminal 51a and the first-stage FET 53; an interstage matching circuit 55 provided between the first-stage FET 53 and the final-stage FET 56; and an output matching circuit 59 provided between the final-stage FET 56 and the output terminal 51b. A first resistor 54 is provided between the gate and source of the first-stage FET 53, and a second resistor 57 is provided between the gate and source of the final-stage FET 56. In addition, a gate bias control terminal is connected to the connecting point of the second resistor 57 with the gate of the FET 56 via a third resistor 58.

In the third preferred embodiment, the FETs of the high-frequency power amplifier 50 are p-pocket FETs which will be described later. The drains of the respective FETs 53 and 56 are supplied to the supply voltage Vdd via inductors. The gate terminal of the final-stage FET 56 is connected to the gate voltage control terminal via the high-resistance 58. In the third preferred embodiment, principal circuit parameters are as follows. The total gate width of the first-stage FET (Q1) 53 is 1 mm, and the total gate width of the final-stage FET (Q2) 56 is 4 mm. Both of the first-stage stabilized resistance 54 (Rst1) and the final-stage stabilized resistance 57 (Rst2) are 100Ω, and the final-stage gate-bias supplying high-resistance 58 (Rg2) is 640Ω. Both of the threshold voltages of the FETs (Q1) 53 and (Q2) 56 are −0.3 V. In order to accomplish the objects of the present invention, the supply voltage Vdd and the gate bias potential Vg applied to the gate of the final-stage FET 56 should be in the following range.

$$Vdd \leq 2.4 \text{ V}$$

$$Vg \geq 0 \text{ V}$$

Figure 15:
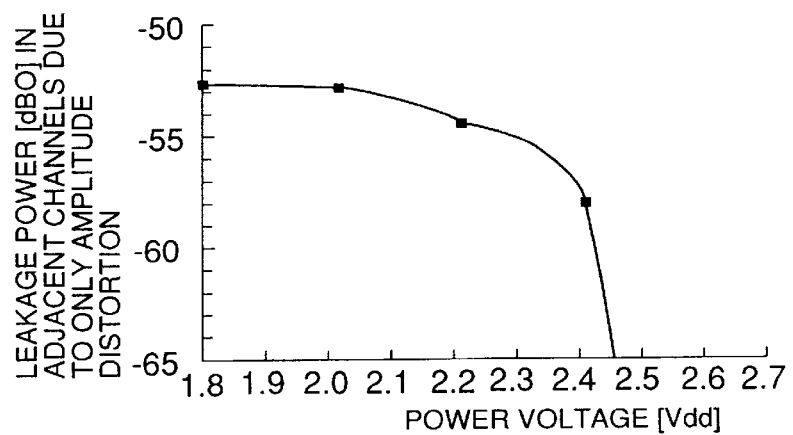
FIG. 15 is a graph showing the dependence of the leakage power in adjacent channels on the supply voltage when only amplitude distortion exists.
Figure 16:
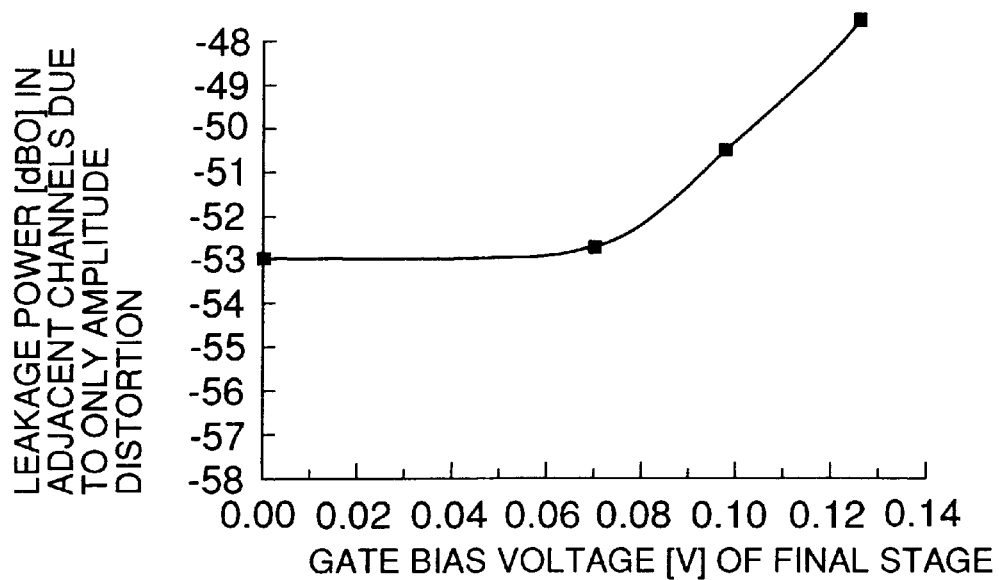
FIG. 16 is a graph showing the dependence of the leakage power in adjacent channels on the gate bias when only amplitude distortion exists.

In order to validate the advantages in the third preferred embodiment, the non-linear parameters of the high-frequency power amplifier 50 were measured using Vdd and Vg as parameters. Using the measured results, the magnitude of the amplitude distortion was derived when the leakage power in adjacent channels is −58 dBc. The magnitude of the amplitude distortion was expressed as the leakage power in adjacent channels if only the amplitude distortion existed. The results are shown in FIGS. 15 and 16. FIG. 15 shows the relationship between Vdd and the leakage power in adjacent channels due to only the amplitude distortion, and FIG. 16 shows the relationship between Vg and the leakage power in adjacent channels due to only the amplitude distortion.

As can be clearly seen from FIG. 15, in the case of "Vdd≦2.4 V", the leakage power in adjacent channel due to only the amplitude distortion is greater (worse) than the reference value (−58 dBc) of the actual leakage power in adjacent channels. This means that the amplitude distortion and the phase distortion cancel each other out. In the graph of FIG. 15, Vg is 0 V. In addition, as can be clearly seen from FIG. 16, although the amplitude distortion increases as the gate voltage increases, the leakage power in adjacent channels satisfies the reference value since the amount canceled by the phase distortion increases. In FIG. 16, Vdd is 2 V.

It is considered that, although the amplitude distortion is increased by decreasing the supply voltage to a lower value than the conventional value and by increasing the gate bias potential to a higher value than the conventional value, the amplitude distortion and the phase distortion cancel each other out to maintain the leakage power in adjacent channels at the reference value. Thus, the present invention is characterized in that the amplitude distortion and the phase distortion cancel each other out while increasing the amplitude distortion to realize a good leakage power in adjacent channels, by decreasing the Vdd and increasing the Vg, which have not been conventionally carried out to maintain the linearity.

In the measured ranges shown in FIGS. 15 and 16, the best advantages of the present invention can be obtained when Vdd=2 V and Vg=120 mV. In this case, the output power was 21 dBm, and a value required for a high-frequency power amplifier for the transmission of a PHS portable terminal was obtained at a low supply voltage of 2 V.

Figure 17:
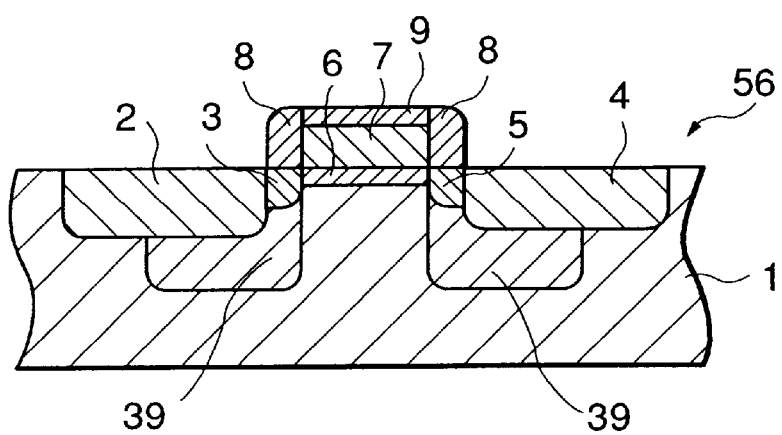
FIG. 17 is a sectional view of a MESFET for use in the third preferred embodiment of a high-frequency power amplifier according to the present invention.

Referring to FIG. 17, the structure of the p-pocket type FET 56 for use in the third preferred embodiment of a high-frequency power amplifier, according to the present invention, will be described below.

In FIG. 17, the MESFET 56 comprises: a semi-insulating GaAs (gallium arsenide) substrate 1; a high-concentration n-type source region 2; an intermediate-concentration n-type source region 3, associated with the high-concentration n-type source region 2, for serving as a source; a high-concentration n-type drain region 4; an intermediate-concentration n-type drain region 5, associated with the high-concentration n-type drain region 4, for serving as a drain; a low-concentration n-type channel 6; p-type regions 39, one of which contacts only the source and the other of which contacts only the drain; a Schottky gate electrode 7 of tungsten nitride, on which tungsten 9 is stacked and which has a gate length of about 0.8 micrometers; and a pair of spacers 8 formed on the side walls of the gate electrode 7. The MESFET 56 in this third preferred embodiment is substantially the same as the FET 36 in the first preferred embodiment shown in FIG. 8, except that the tungsten 9 is stacked on the gate electrode.

Figure 18:
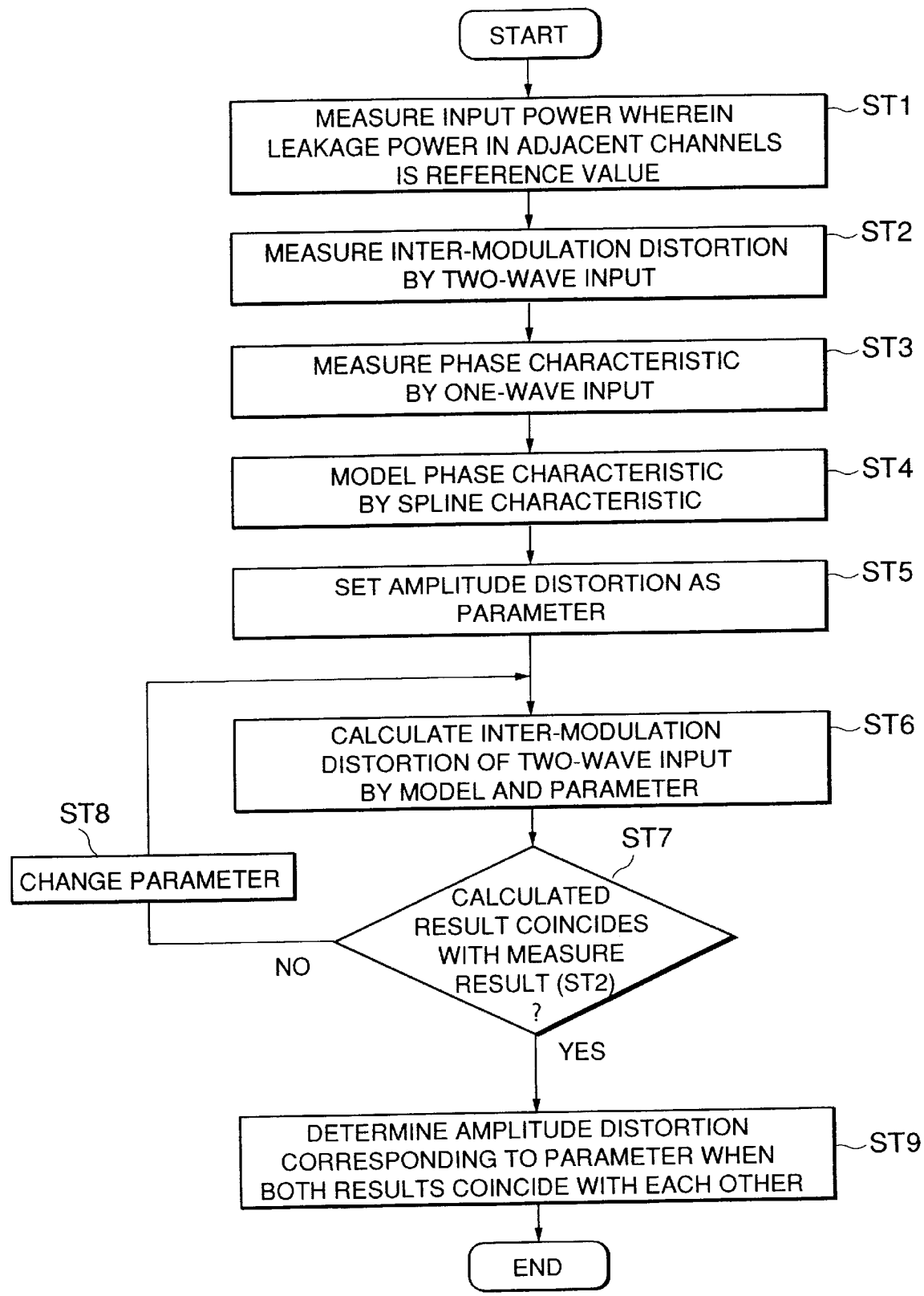
FIG. 18 is a flow chart of a process for deriving amplitude distortion in the third preferred embodiment.

Referring to the flow chart of FIG. 18, an example of a process for the measurement and analysis, which were carried out to derive the results of FIGS. 15 and 16, will be described below.

First, at step ST1, an input electric power, wherein the leakage power in adjacent channels is the reference value (−58 dBc), is measured. Then, at step ST2, the inter-modulation distortion rate caused by the two-wave input is measured. At step ST3, the phase characteristic caused by the one-wave input is measured, and then, at step ST4, the phase characteristic is modeled by a spline function. Then, at step ST5, the amplitude distortion is set as a parameter. This parameter is first set to be, e.g., "0", at which there is no amplitude distortion. Then, this parameter is sequentially changed when the calculated results are not coincident with the measured results at step ST7.

At step 6, the inter-modulation distortion caused by the two-wave input is calculated using the phase characteristic modeled at step ST4 and the parameter of the amplitude distortion set at step ST5. In this case, the input electric power of the two-wave input uses the results measured at step ST1. Then, it is determined at step ST7 whether the results calculated at step ST6 are coincident with the results of the inter-modulation distortion measured at step ST2. When the calculated results are not coincident with the measured results, it is determined that the parameter set at step ST5 is not an appropriate value, so that the parameter for the amplitude distortion is changed at step ST8. Then, the steps ST6 through ST8 are repeated until the amplitude distortion when the calculated results are coincident with the measured results is found out at step ST7. Finally, at step ST9, the leakage power in adjacent channels when only the amplitude distortion exists is calculated using the results of step ST7.

Furthermore, in the two-wave input at step ST2, the inter-modulation distortion was measured when one input power level is less than the other input power level by 10 dB, unlike the usual two-wave input in which two signals having the same power level and frequencies close to each other are inputted. The reason why such a method was adopted is as follows.

The dependence of the output power on the input power at the time of the usual two-wave input (Pin-Pout characteristic) is different from the Pin-Pout characteristic at the time of the $\pi/4$ shift QPSK signal input, which is used when the leakage power in adjacent channels is measured. In order to associate the leakage power in adjacent channels with the inter-modulation distortion, both of the Pin-Pout characteristics must be coincident with each other. On the other hand, in the case of the aforementioned 10 dB offset two-wave input, the Pin-Pout characteristic is substantially coincident with that of the $\pi/4$ shift QPSK signal input.

What is claimed is:

1. A high-frequency power amplifier including a signal input terminal for inputting an input signal, a signal output terminal for outputting an output signal, a plurality of stages of field effect transistors which are connected to each other via an interstage matching circuit provided between a front-stage drain and rear-stage gate, a ground potential terminal being connected to each of sources of said field effect transistors, and a supply voltage terminal being supplied to each of drains of said field effect transistors, an input matching circuit provided between said signal input terminal and a gate of a first-stage field-effect transistor which is one of said field effect transistors, and an output matching circuit provided between a drain of a final-stage field effect transistor, which is one of said field effect transistors, and said signal output terminal, wherein at least said final-stage field effect transistor comprises:

a semi-insulating substrate;

a channel region having a first conductive type and formed on a surface of said substrate;

a gate electrode formed on said channel region and having a Schottky junction between said substrate and said gate electrode;

a pair of first regions of said first conductive type formed on said substrate so as to be self-aligned with said gate electrode;

a pair of pocket regions of a second conductive type formed beneath said first regions so as to be self-aligned with said gate electrode;

a pair of spacers formed on side walls of said gate electrode;

a pair of second regions of said first conductive type formed on said substrate so as to be self-aligned with said gate electrode and said spacers, and wherein said pair of second regions have a higher impurity concentration than that of said first regions, and are associated with said pair of first regions for serving as source and drain regions.

2. A high-frequency power amplifier according to claim 1, wherein, in said pair of first regions and said pair of said second regions, a first pair of first and second regions on one side of said channel region constitute said source region of said first conductive type, a second pair of first and second regions on the other side of said channel region constitute said drain region of said first conductive type, and said regions of second conductive type are provided near said channel region in contact with any of said source region and said drain region.

3. A high-frequency power amplifier according to claim 2, wherein at least one of said source region and said drain region has a respective first region contacting said channel region and a respective second region associated with said first region located a distance from said channel region, and
wherein an impurity concentration of said respective first region is lower than that of said respective second region.

4. A high-frequency power amplifier according to claim 3, wherein said regions of the second conductive type are provided beneath said first regions.

5. A high-frequency power amplifier according to claim 1, wherein said regions of the second conductive type are depleted by a built-in potential formed between said source and drain region and respective regions of the second conductive type.

6. A high-frequency power amplifier according to claim 1,
wherein said high-frequency power amplifier is connected to a battery having a difference between a filled potential and a terminated potential, receives a high-frequency signal, and amplifies the high-frequency signal to a desired value, and
wherein said high-frequency power amplifier comprises:
a MESFET which has a gate connected to a first impedance matching circuit on an input side, and a drain connected to said battery and a second impedance matching circuit on an output side;
gate bias means connected between said battery and said drain of said MESFET, for determining a gate bias based on a potential between said filled potential and said terminated potential of said battery; and
feedback means for causing said gate bias of said MESFET to be variable so as to maintain an output power at a desired value by supplying said gate bias determined by said gate bias means to said first impedance matching circuit.

7. A high-frequency power amplifier according to claim 6, wherein a relatively low voltage of 2V to 1V is supplied to said drain, and which supplies an output power of said desired value even when said terminated potential is said relatively low voltage.

8. A high-frequency power amplifier according to claim 1,
wherein said field effect transistor is connected to a high-potential power supply via an inductance element, and comprises a grounded source, a gate to which a high-frequency input signal is supplied and which is connected via a high-resistance to a terminal for supplying a DC potential, and a drain which outputs a high-frequency signal, and
wherein said field effect transistor has a supply voltage of less than 2.4V, and said gate electrode receives a supply of said DC voltage more than 0V.

9. A high-frequency power amplifier according to claim 8, wherein said amplifier comprises a plurality of stages of unit power amplifiers, and wherein at least a final-stage unit power amplifier has said field effect transistor.

10. A mobile communication device including an antenna configured to transmit and receive a high-frequency signal, a high-frequency receiving circuit configured to demodulate the-high-frequency signal received by said antenna, a modulator circuit configured to modulate a signal to be transmitted from said antenna, and a high-frequency power amplifier configured to amplify said high-frequency signal as an output of said modulator circuit to said antenna, wherein said high-frequency power amplifier is connected to a battery having a difference between a filled potential and a terminated potential, and amplifies said high-frequency signal which is intermittently received in a predetermined cycle to amplify the high-frequency signal to a desired value, and wherein said high-frequency power amplifier comprises:
a MESFET having a gate connected to a first impedance matching circuit on an input side, and a drain connected to said battery and a second impedance matching circuit on an output side,
gate bias means connected between said battery and said drain of said MESFET, for detecting a gate bias based on a potential between said filled potential and said terminated potential of said battery, and
feedback means for causing said gate bias of said MESFET to be variable so as to maintain an output power at a desired value by supplying said gate bias determined by said gate bias means to said first impedance matching circuit.

11. A mobile communication device according to claim 10, wherein an amplifying power of a relatively low voltage is supplied from a battery of a low supply voltage by causing said gate bias of said MESFET to be variable, without providing a step-up or step-down transformer circuit function in a power supply circuit containing at least said battery.

12. A mobile communication device according to claim 10,
wherein said high-frequency power amplifier comprises a plurality of field effect transistors, in which a drain of a first-stage transistor is connected via an interstage matching circuit to a gate of a rear-stage transistor, and a potential is supplied to each source of said plurality of transistors and a supply potential voltage is supplied to each drain of said plurality of transistors; and
wherein at least said final-stage field effect transistor in said plurality of stages of said field effect transistors comprises:
semi-insulating substrate,
a channel region having a first conductive type and formed on a surface of said substrate,
gate electrode formed on said channel region and having a Schottky junction between said substrate and said gate electrode,
a pair of first regions of a first conductive type formed on said substrate so as to be self-aligned with said gate electrode,
a pair of pocket regions of a second conductive type formed beneath said first regions so as to be self-aligned with said gate electrode,
a pair of spacers formed on side walls of said gate electrode, and
a pair of second regions of a first conductive type formed on said substrate so as to be self-aligned with said gate electrode and said spacers; and wherein said pair of second regions have a higher impurity concentration than that of said first regions, and are associated with said pair of first regions for serving as source and drain regions.

13. A mobile communication device according to claim 12, wherein said high-frequency power amplifier comprises a field effect transistor having a grounded source; a gate electrode to which a high-frequency input signal is supplied and which is connected via a high resistance to a terminal for supplying a DC potential, and a drain connected via an inductance element to a high-potential power supply to output a high-frequency signal; and wherein said field effect transistor has a supply voltage less than 2.4V and said gate electrode receives a DC potential more than 0V.

14. A mobile communication device according to claim 13, wherein said high-frequency power amplifier comprises a plurality of stages of unit power amplifiers and wherein at least a final-stage unit power amplifier has said field effect transistor.

* * * * *